US010155252B2

United States Patent
Lee et al.

(10) Patent No.: US 10,155,252 B2
(45) Date of Patent: Dec. 18, 2018

(54) SEMICONDUCTOR APPARATUS AND WASHING METHOD

(71) Applicant: Taiwan Semiconductor Manufacturing Co., Ltd, Hsin-Chu (TW)

(72) Inventors: Chun-Yu Lee, Zhudong Township, Hsinchu County (TW); Sheng-Hung Lo, Hsinchu (TW); Wen-Lung Ho, Baoshan Township, Hsinchu County (TW); Wen-Sung Tseng, Zhubei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 505 days.

(21) Appl. No.: 14/700,533

(22) Filed: Apr. 30, 2015

(65) Prior Publication Data

US 2016/0322240 A1     Nov. 3, 2016

(51) Int. Cl.
    *B08B 3/02*      (2006.01)
    *H01L 21/67*      (2006.01)

(52) U.S. Cl.
    CPC .......... *B08B 3/02* (2013.01); *H01L 21/67051* (2013.01)

(58) Field of Classification Search
    CPC ................. B08B 3/02; H01L 21/67028; H01L 21/67051
See application file for complete search history.

(56) References Cited

U.S. PATENT DOCUMENTS

| 6,247,479 | B1 * | 6/2001 | Taniyama | ............... B08B 3/024 |
| | | | | 134/133 |
| 6,503,333 | B2 | 1/2003 | Twu et al. | |
| 7,837,804 | B2 | 11/2010 | Ohno et al. | |
| 8,545,119 | B2 | 10/2013 | Ookouchi et al. | |
| 2003/0226577 | A1 * | 12/2003 | Orll | ................... H01L 21/67051 |
| | | | | 134/1.3 |
| 2004/0065352 | A1 * | 4/2004 | Yonekura | .................. B08B 3/02 |
| | | | | 134/25.4 |
| 2004/0261817 | A1 * | 12/2004 | Araki | ............... H01L 21/67051 |
| | | | | 134/2 |
| 2006/0246727 | A1 | 11/2006 | Hsieh et al. | |
| 2008/0047589 | A1 * | 2/2008 | Huang | ..................... B08B 3/02 |
| | | | | 134/33 |

(Continued)

FOREIGN PATENT DOCUMENTS

| CN | 1947227 A | 4/2007 |
| CN | 103515220 A | 1/2014 |

(Continued)

OTHER PUBLICATIONS

U.S. Appl. No. 14/658,888, filed Mar. 16, 2015.
U.S. Appl. No. 14/163,045, filed Jan. 24, 2014.

*Primary Examiner* — Douglas Lee
(74) *Attorney, Agent, or Firm* — McClure, Qualey & Rodack, LLP

(57) ABSTRACT

A semiconductor apparatus is provided. The semiconductor apparatus includes a wafer carrier, and a cup surrounding the wafer carrier. The semiconductor apparatus also includes a bottom washing device located between the wafer carrier and the cup, and configured to spray washing liquid onto the cup. Therefore, the cup can be washed by the bottom washing device.

18 Claims, 10 Drawing Sheets

(56) References Cited

U.S. PATENT DOCUMENTS

| | | | |
|---|---|---|---|
| 2008/0066786 A1* | 3/2008 | Hsieh | H01L 21/67028 134/34 |
| 2011/0000509 A1 | 1/2011 | Chen et al. | |
| 2012/0273011 A1* | 11/2012 | Osada | H01L 21/67051 134/33 |
| 2013/0340796 A1* | 12/2013 | Kawano | H01L 21/02057 134/28 |

FOREIGN PATENT DOCUMENTS

| | | |
|---|---|---|
| TW | 201214537 | 4/2007 |
| TW | 200809918 A | 2/2008 |

\* cited by examiner

SEMICONDUCTOR APPARATUS AND WASHING METHOD

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a wafer, and patterning the various material layers using lithography process to form circuit components and elements thereon. Many integrated circuits are typically manufactured on a single wafer, and individual dies on the wafer are singulated by sawing between the integrated circuits along a scribe line. The individual dies are typically packaged separately, in multi-chip modules, or in other types of packaging, for example.

After a semiconductor apparatus performs a semiconductor manufacturing processes on a wafer, some contaminants may form or fall on mechanisms of the semiconductor apparatus. The contaminants may fall on a subsequent wafer from the mechanisms, and cause defects on the wafer.

Although existing devices for removing the contaminants have been generally adequate for their intended purposes, they have not been entirely satisfactory in all respects. Consequently, it would be desirable to provide a solution for removing the contaminants on the mechanisms of a semiconductor apparatus.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
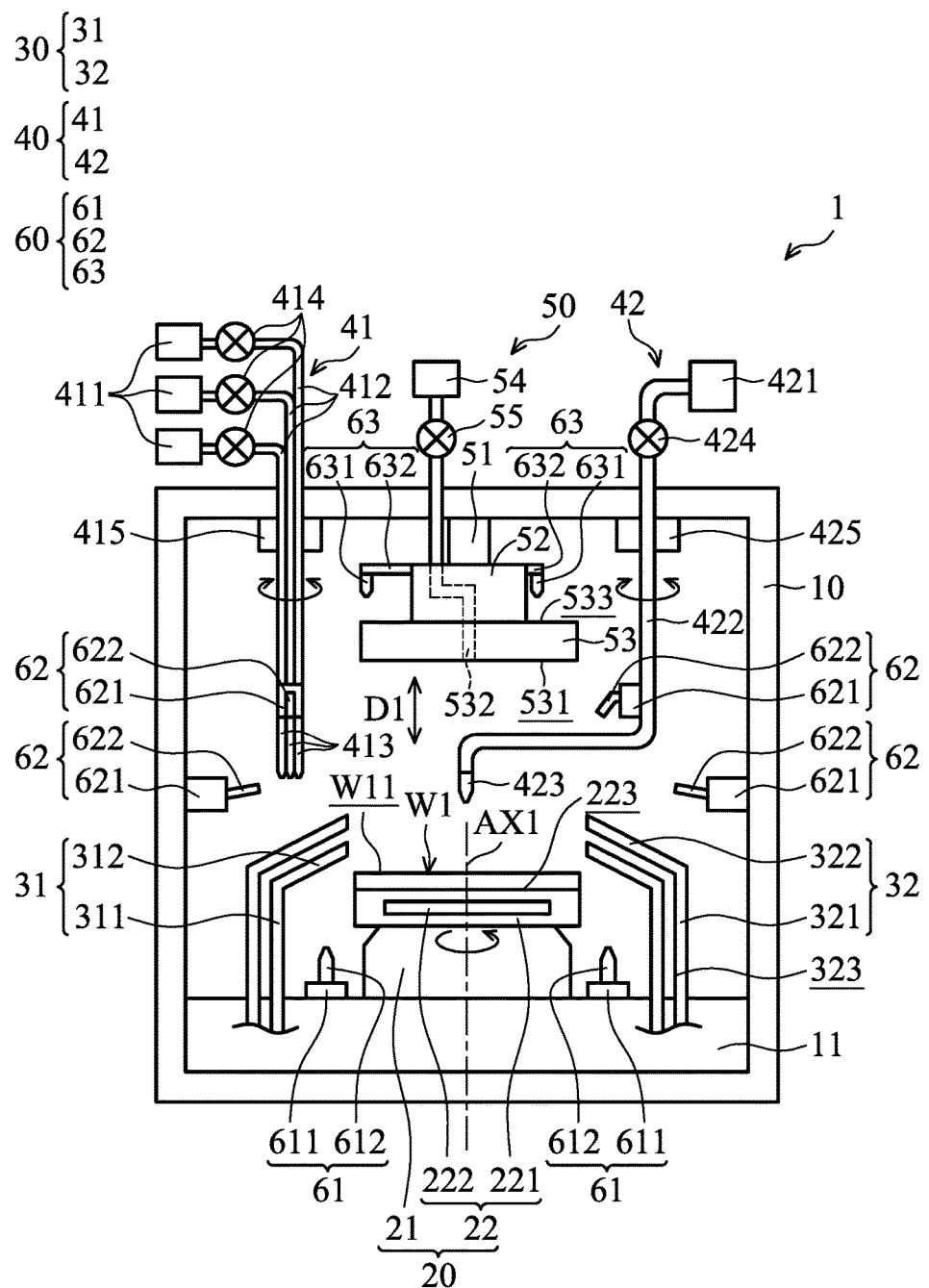
FIG. 1 is a schematic view of a semiconductor apparatus in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

A semiconductor apparatus and a washing method are provided. The semiconductor apparatus is configured to perform a semiconductor manufacturing processes on a wafer.

In some embodiments, the semiconductor apparatus is a wafer cleaning apparatus, a photoresist developing apparatus, a chemical mechanical polishing (CMP) apparatus, or another suitable apparatus. In some embodiments, the semiconductor manufacturing process is a wafer cleaning process, a photoresist developing process, a CMP process, or another suitable process.

FIG. 1 is a schematic view of a semiconductor apparatus 1 in accordance with some embodiments of the disclosure. In some embodiments, the semiconductor apparatus 1 is a wafer cleaning apparatus, such as a wet cleaning apparatus. The wet cleaning apparatus 1 is configured to clean a wafer W1.

In some embodiments, the wet cleaning apparatus 1 performs a wafer cleaning process to remove remains on the wafer W1. In some embodiments, the remains are particles. In some embodiments, the remains include polymer, resin, photoresist, and/or metal.

The wet cleaning apparatus 1 includes a process chamber 10, a wafer carrier 20, cups 30, dispensing devices 40, a cleaning device 50, and washing devices 60. The process chamber 10 includes a stage 11 located at a bottom of the process chamber 10.

The wafer carrier 20 is located in the process chamber 10, and disposed on the stage 11. The wafer carrier 20 is configured to hold the wafer W1. The cups 30 are located in the process chamber 10, and disposed on the stage 11. The cups 30 are surrounding the wafer carrier 20.

The dispensing devices 40 are disposed on the process chamber 10. The dispensing devices 40 are configured to dispense cleaning liquid to clean the wafer W1. The cleaning device 50 is located in the process chamber 10, and disposed on the top wall of the process chamber 10. The cleaning device 50 is configured to dispense washing liquid to clean the wafer W1.

In some embodiments, the cleaning liquid is photoresist stripper, developing liquid, water, such as DI water, or another chemical liquid which can clean effectively. In some embodiments, the cleaning liquid includes $(NH_4)_2SO_4$, $H_2O$, DMSO (dimethyl sulfoxide), MEA (methyl ethyl amide), BDG (diethylene glycol monobutyl ether)), NEA (n,n-dimethylacetamide), or NMP (n-methyl pyrrolidone).

The washing devices 60 are located in the process chamber 10. The washing devices 60 are configured to spray washing liquid to clean the cups 30, dispensing device 40, and/or cleaning device 50. In some embodiments, the washing liquid is water, such as deionized water (DI water), or another chemical liquid which can clean effectively.

The wafer carrier 20 includes a carrier base 21 and a wafer chuck 22. The carrier base 21 is configured to rotate the wafer chuck 22 about a rotating axis AX1. In some embodiments, the rotating axis AX1 is perpendicular to the carrier surface 223 of the wafer chuck 22, and passes through the center of the carrier surface 223. The wafer chuck 22 is disposed on the carrier base 21. The wafer chuck 22 is configured to hold the wafer W1.

In some embodiments, the wafer chuck 22 is an electrostatic chuck. The wafer chuck 22 includes a chuck body 221 and an electrode 222. The chuck body 221 is disposed on the stage 11. In some embodiments, the chuck body 221 is a disk structure parallel to a horizontal plane. The wafer W1 is disposed on the carrier surface 223 of the chuck body 221 when the wafer W1 is held by the wafer chuck 22.

The electrode 222 is embedded in the chuck body 221. The electrode 222 is configured to generate an electrostatic field for holding the wafer W1 on the wafer chuck 22. In some embodiments, the electrode 222 is parallel to the carrier surface 223 of the chuck body 221.

The cups 30 are hollow columnar structures surrounding the wafer chuck 22. In other words, the wafer carrier 20 and the wafer W1 held on the wafer carrier 20 are located in the cups 30. In some embodiments, there is only one cup 30 located in the process chamber 10, and disposed on the stage 11.

In some embodiments, the cup 30 includes a first cup 31 and a second cup 32. The first cup 31 is surrounding the wafer carrier 20 and the wafer W1. The second cup 32 is surrounding the first cup 31. In other words, the first cup 31 is located between the wafer carrier 20 and the second cup 32.

The first cup 31 and the second cup 32 can be raised to an operation position as shown in FIG. 1, or lowered to a transportation position relative to the stage 11. The first cup 31 and the second cup 32 are higher than the wafer chuck 22 and the wafer W1 relative to the stage 11 when the first cup 31 and the second cup 32 are in the operation position. The first cup 31 and the second cup 32 are lower than the carrier surface 223 of the wafer chuck 22 relative to the stage 11 when the first cup 31 and the second cup 32 are in the transportation position.

When the wafer W1 is transported into the process chamber 10, the first cup 31 and the second cup 32 are lowered to the transportation position. After the wafer W1 is put on the carrier surface 223 of the wafer chuck 22 by a transporting arm (not shown in figures), the first cup 31 and/or the second cup 32 are raised to the operation position.

During a wafer cleaning process, the wafer chuck 22 is rotated by the carrier base 21, and the wafer W1 is rotated following the rotation of the wafer chuck 22. The first cup 31 and/or the second cup 32 are located at the operation position. A cleaning liquid or a washing liquid is dispensed on the wafer W1, and sprayed out from the edge of the wafer W1 to the inner surface 313 of the first cup 31 and/or the inner surface 323 of the second cup 32. The first cup 31 and the second cup 32 are configured to block the cleaning liquid or the washing liquid spraying from the edge of the wafer W1.

The first cup 31 includes a first surrounding wall 311 and a first cover wall 312. The first surrounding wall 311 and the first cover wall 312 are hollow columnar structures. The first surrounding wall 311 is surrounding the carrier base 21, the wafer chuck 22, and the wafer W1. In some embodiments, the first surrounding wall 311 is substantially perpendicular to the stage 11 or a horizontal plane. In some embodiments, the distance between the first surrounding wall 311 and the carrier base 21 (or the wafer chuck 22) is in a range from about 80 mm to about 150 mm.

The first cover wall 312 is connected to the top of the first surrounding wall 311, and inclined to the first surrounding wall 311. The first cover wall 312 gradually extends to the rotating axis AX1 from the bottom of the first cover wall 312 to the top of the first cover wall 312. In other words, the first cover wall 312 is gradually narrowed from the bottom of the first cover wall 312 to the top of the first cover wall 312.

In some embodiments, the height of the first cover wall 312 relative to the stage 11 in the operation position is about 1 times to about 2 times the height of the wafer chuck 22 relative to the stage 11.

The second cup 32 includes a second surrounding wall 321 and a second cover wall 322. The second surrounding wall 321 and the second cover wall 322 are hollow columnar structures. The second surrounding wall 321 is surrounding and distance from the first surrounding wall 311. In some embodiments, the second surrounding wall 321 is substantially perpendicular to the stage 11 or a horizontal plane. In some embodiments, the second surrounding wall 321 is parallel to the first surrounding wall 311.

The second cover wall 322 is connected to the top of the second surrounding wall 321, and inclined to the second surrounding wall 321. The second cover wall 322 gradually extends to the rotating axis AX1 from the bottom of the second cover wall 322 to the top of the second cover wall 322. In other words, the second cover wall 322 is gradually narrowed from the bottom of the second cover wall 322 to the top of the second cover wall 322. In some embodiments, the second cover wall 322 is surrounding the first cover wall 312 and parallel to the first cover wall 312.

In some embodiments, the height of the second cover wall 322 relative to the stage 11 in the operation position is about 1.1 times to about 2.5 times the height of the wafer chuck 22 relative to the stage 11. The height of the second cover wall 322 relative to the stage 11 in the operation position is greater than the height of the first cover wall 312 relative to the stage 11.

In some embodiments, the dispensing device 40 includes a dispensing device 41 and a dispensing device 42. In some embodiments, there is only one dispensing device 40 disposed on the process chamber 10.

The dispensing device 41 includes tanks 411, tubes 412, dispensing nozzles 413, pumps 414, and a rotation element 415. Each of the tanks 411 contains one kind of cleaning liquid. Each of the tubes 412 is connected with one of the tanks 411 and one of the dispensing nozzles 413. In some embodiments, the tubes 412 are arranged side by side and parallel to each other. In some embodiments, the tubes 412 pass though the wall of the process chamber 10.

The dispensing nozzles 413 are located in the process chamber 10, and connected to the ends of the tubes 412. The dispensing nozzles 413 are configured to dispense cleaning liquid to the wafer W1. In some embodiments, the dispensing nozzles 413 are arranged side by side and parallel to each other. The pumps 414 are disposed on the tubes 412, and configured to supply the cleaning liquid in the tanks 411 to the dispensing nozzles 413 via the tubes 412.

The rotation element 415 is located in the process chamber 10. In some embodiments, the rotation element 415 is disposed on the top wall of the process chamber 10. The rotation element 415 is configured to rotate the tubes 412 located in the process chamber 10.

The tubes 412 and the dispensing nozzles 413 are located at an initial position as shown in FIG. 1. In some embodiments, the tubes 412 and the dispensing nozzles 413 are not located over the wafer chuck 22 or the wafer W1 when the tubes 412 and the dispensing nozzles 413 are located at the initial position.

During a wafer cleaning process, the wafer W1 is rotated by the wafer chuck 22. The rotation element 415 rotates the dispensing nozzles 413 into a dispensing position over the central area of the wafer chuck 22 or the wafer W1. In some embodiments, the dispensing nozzles 413 are rotated along a horizontal plane. At least one of the dispensing nozzles 413 dispenses the cleaning liquid to the central area of the top surface W11 of the wafer W1.

In some embodiments, the dispensing device 42 is opposite to the dispensing device 41. The dispensing device 42 includes a tank 421, a tube 422, a dispensing nozzle 423, a pump 424, and a rotation element 425.

The tank 421 contains cleaning liquid. In some embodiments, the tank 421 contains cleaning liquid or washing liquid. The tube 422 is connected with the tank 421 and the dispensing nozzle 423. In some embodiments, the tube 422 passes though the wall of the chamber.

The dispensing nozzle 423 is located in the process chamber 10, and connected to the end of the tube 422. The dispensing nozzle 423 is configured to dispense cleaning liquid or washing liquid to the wafer W1. The pump 424 is disposed on the tube 422, and configured to supply the cleaning liquid or the washing liquid in the tank 421 to the dispensing nozzle 423 via the tube 422.

The rotation element 425 is located in the process chamber 10. In some embodiments, the rotation element 425 is disposed on the top wall of the process chamber 10. The rotation element 425 is configured to rotate the tube 422 located in the process chamber 10.

Figure 3A:
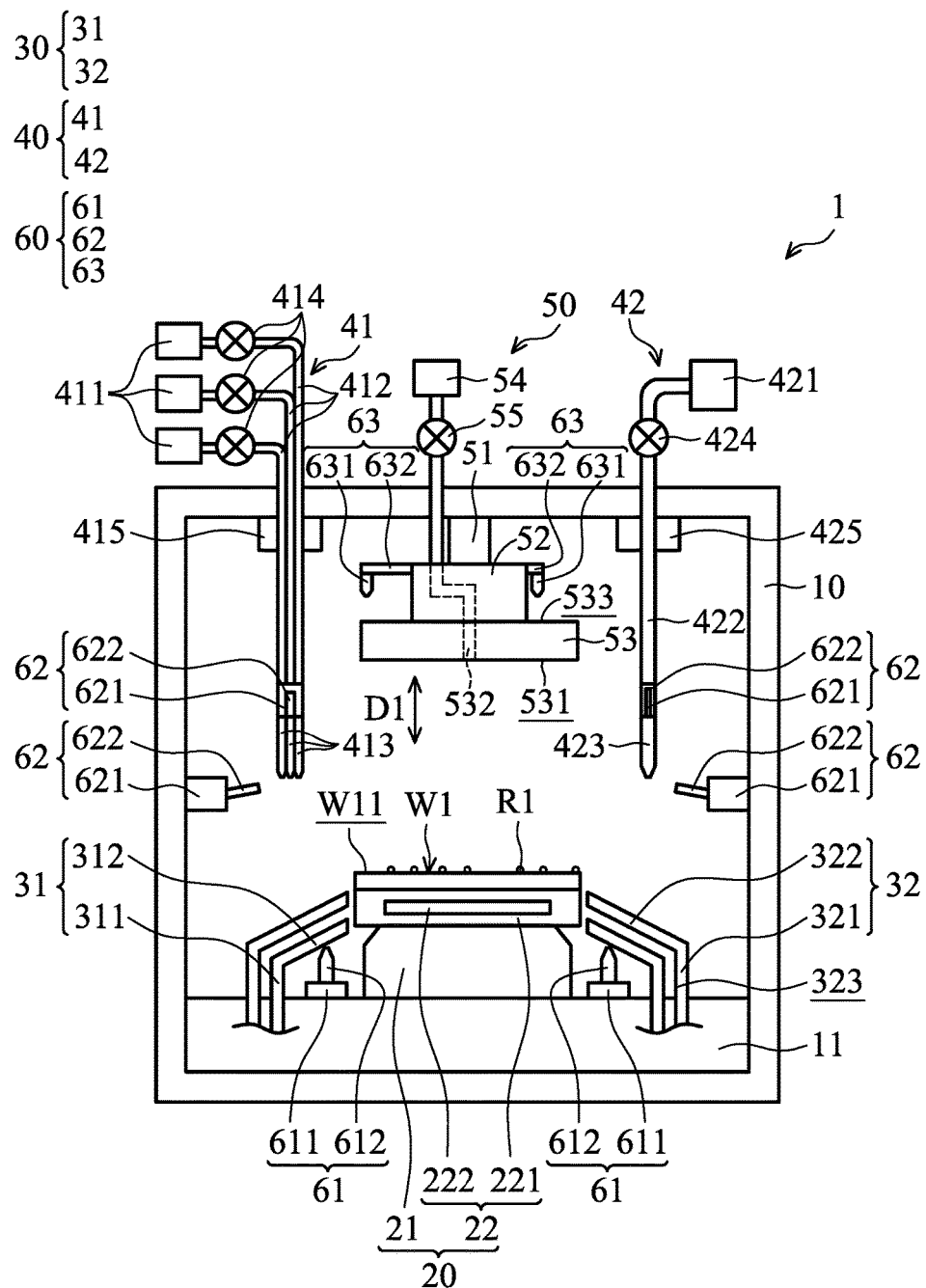
FIGS. 3A to 3D are schematic views of a semiconductor apparatus during an intermediate stage of the wafer cleaning method in accordance with some embodiments of the disclosure.

The tube 422 and the dispensing nozzle 423 are located at an initial position as shown in FIG. 3A. In some embodiments, the tube 422 and the dispensing nozzle 423 are not located over the wafer chuck 22 or the wafer W1 when the tube 422 and the dispensing nozzle 423 are located at the initial position.

During a wafer cleaning process, the wafer W1 is rotated by the wafer chuck 22. The rotation element 425 rotates the dispensing nozzle 423 into a dispensing position over the central area of the wafer chuck 22 or the wafer W1 as shown in FIG. 1. In some embodiments, the dispensing nozzle 423 is rotated along a horizontal plane. The dispensing nozzle 423 dispenses the cleaning liquid or the washing liquid to the center of the top surface W11 of the wafer W1.

The cleaning device 50 includes an elevating mechanism 51, a rotation mechanism 52, a cleaning plate 53, a tank 54, and a pump 55. The elevating mechanism 51 is disposed on the top wall of the process chamber 10. The elevating mechanism 51 is configured to raise or lower the cleaning plate 53 along an elevating direction D1. In some embodiments, the elevating direction D1 is a vertical direction.

The rotation mechanism 52 is located in the process chamber 10, and connected to the elevating mechanism 51. The rotation mechanism 52 is configured to rotate the cleaning plate 53. The cleaning plate 53 is connected to the rotation mechanism 52. The cleaning plate 53 is located over the wafer chuck 22. The cleaning surface 531 of the cleaning plate 53 faces the carrier surface 223 of the wafer chuck 22.

In some embodiments, the cleaning plate 53 is a disk structure. The cleaning surface 531 is parallel to a horizontal plane or the top surface W11 of the wafer W1. The area of the cleaning surface 531 is substantially equal to the area of the top surface W11 of the wafer W1.

A liquid channel 532 is formed on the cleaning surface 531 and passes through the cleaning plate 53. The liquid channel 532 is configured to dispense washing liquid on the wafer W1. In some embodiments, the end of the liquid channel 532 is located at the central area of the cleaning surface 531. In some embodiments, the end of the liquid channel 532 is located at the center of the cleaning surface 531.

The tank 54 contains washing liquid. The pump 55 is configured to supply the washing liquid in the tank 54 to the liquid channel 532.

The cleaning device 50 is located at a top position as shown in FIG. 1. During a wafer cleaning process, the cleaning plate 53 is moved toward the wafer W1. When the cleaning surface 531 is adjacent to the top surface W11 of the wafer W1 at a cleaning position, the liquid channel 532 dispenses washing liquid to the gap between the cleaning surface 531 and the top surface W11. Moreover, the wafer W1 is rotated by the wafer chuck 22, and the cleaning plate 53 is rotated by the rotation mechanism 52. In some embodiments, the wafer W1 and the cleaning plate 53 are rotated in the same direction.

As shown in FIG. 1, the washing device 60 includes bottom washing devices 61, middle washing devices 62, and top washing devices 63.

The bottom washing devices 61 are disposed on the stage 11, and are located between the wafer carrier 20 and the first cup 31. In some embodiments, the bottom washing devices 61 are disposed on the chuck body 221.

The bottom washing devices 61 are configured to spray washing liquid to the inner surface 313 of the first surrounding wall 311 and the first cover wall 312 of the first cup 31. The bottom washing devices 61 are also configured to spray washing liquid to the inner surface 323 of the second surrounding wall 321 and the second cover wall 322 of the second cup 32. Therefore, the contaminants on the inner surface 313 of the first cup 31 or the inner surface 323 of the second cup 32 can be removed by the washing liquid.

In some embodiments, the bottom washing device 61 includes a retaining element 611 and a washing nozzle 612. The retaining element 611 is disposed on the stage 11. The retaining element 611 is configured to hold the washing nozzle 612.

The washing nozzle 612 is disposed on the retaining element 611. The washing nozzle 612 is configured to spray washing liquid onto the cups 30. In some embodiments, the washing nozzle 612 is coupled with the tank 421 or 54, and receives the washing liquid from the tank 421 or 54.

The middle washing devices 62 are disposed on the dispensing devices 40 and the wall of the process chamber 10. The middle washing devices 62 are configured to spray washing liquid to the dispensing devices 40. Therefore, the contaminants on the dispensing devices 40 can be removed by the washing liquid.

In some embodiments, one of the middle washing devices 62 is disposed on the tubes 412 to spray washing liquid to the tubes 412 and the dispensing nozzles 413. One of the middle washing devices 62 is disposed on the wall of the process chamber 10 close to the dispensing device 41 to spray washing liquid to the tubes 412 and the dispensing nozzles 413.

In some embodiments, one of the middle washing devices 62 is disposed on the tube 422 to spray washing liquid to the tube 422 and the dispensing nozzle 423. One of the middle washing devices 62 is disposed on the wall of the process chamber 10 close to the dispensing device 42 to spray washing liquid to the tube 422 and the dispensing nozzle 423.

In some embodiments, the middle washing device 62 includes a retaining element 621 and a washing nozzle 622. The retaining element 621 is disposed on the wall of the process chamber 10, the tubes 412 or the tube 422. The retaining element 621 is configured to hold the washing nozzle 622. The washing nozzle 622 is disposed on the retaining element 621.

The washing nozzle 622 is configured to spray washing liquid to the tubes 412, the dispensing nozzles 413, the tube 422, and/or the dispensing nozzle 423. In some embodiments, the washing nozzle 622 is coupled with the tank 421 or 54, and receives the washing liquid from the tank 421 or 54.

The top washing devices 63 are disposed on the cleaning device 50. The top washing devices 63 are configured to spray washing liquid to the cleaning device 50. The top washing devices 63 are disposed on the rotation mechanism 52. Therefore, the contaminants on the cleaning device 50 are removed by the washing liquid.

In some embodiments, one of the top washing devices 63 is configured to spray washing liquid to the edge of the top surface W11 of the cleaning plate 53. When the cleaning plate 53 is rotated by the rotation mechanism 52, the washing liquid is sprayed on the edge of the top surface W11 of the cleaning plate 53 along a circular path.

In some embodiments, one of the top washing devices 63 is configured to spray washing liquid to an area of the top surface W11 of the cleaning plate 53 adjacent to the rotation mechanism 52. In other words, the area is located between the edge and the central area of the top surface W11. When the cleaning plate 53 is rotated by the rotation mechanism 52, the washing liquid is sprayed on the area of the top surface W11 of the cleaning plate 53 along a circular path.

In some embodiments, the top washing device 63 includes a retaining element 631 and a washing nozzle 632. The retaining element 631 is disposed on the side wall of the rotation mechanism 52. The retaining element 631 is configured to hold the washing nozzle 632.

The washing nozzle 632 is disposed on the retaining element 631. The washing nozzle 632 is configured to spray washing liquid to the cleaning plate 53. In some embodiments, the washing nozzle 632 is coupled with the tank 421 or 54, and receives the washing liquid from the tank 421 or 54.

Figure 2:
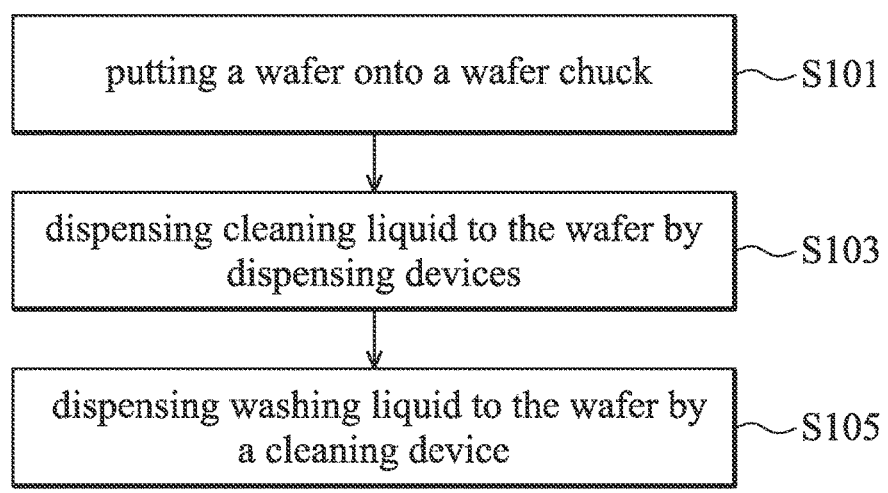
FIG. 2 is a flow chart of a wafer cleaning method in accordance with some embodiments of the disclosure.

FIG. 2 is a flow chart of a wafer cleaning method in accordance with some embodiments of the disclosure. FIGS. 3A to 3D are schematic views of a semiconductor apparatus 1 during an intermediate stage of the wafer cleaning method in accordance with some embodiments of the disclosure.

In step S101, the wafer W1 is put onto the wafer chuck 22. As shown in FIG. 3A, the first cup 31 and the second cup 32 are located at the transportation position. The dispensing devices 41 and 42 are located at the initial position. The cleaning device 50 is located at the top position.

The wafer W1 is transported into the process chamber 10 by a transporting arm (not shown in figures), and put onto the wafer chuck 22 by the transporting arm. After the wafer W1 is put onto the wafer chuck 22, the electrode 222 generates an electrostatic field to attract the wafer W1, and the wafer W1 is held on the wafer chuck 22.

Figure 3B:
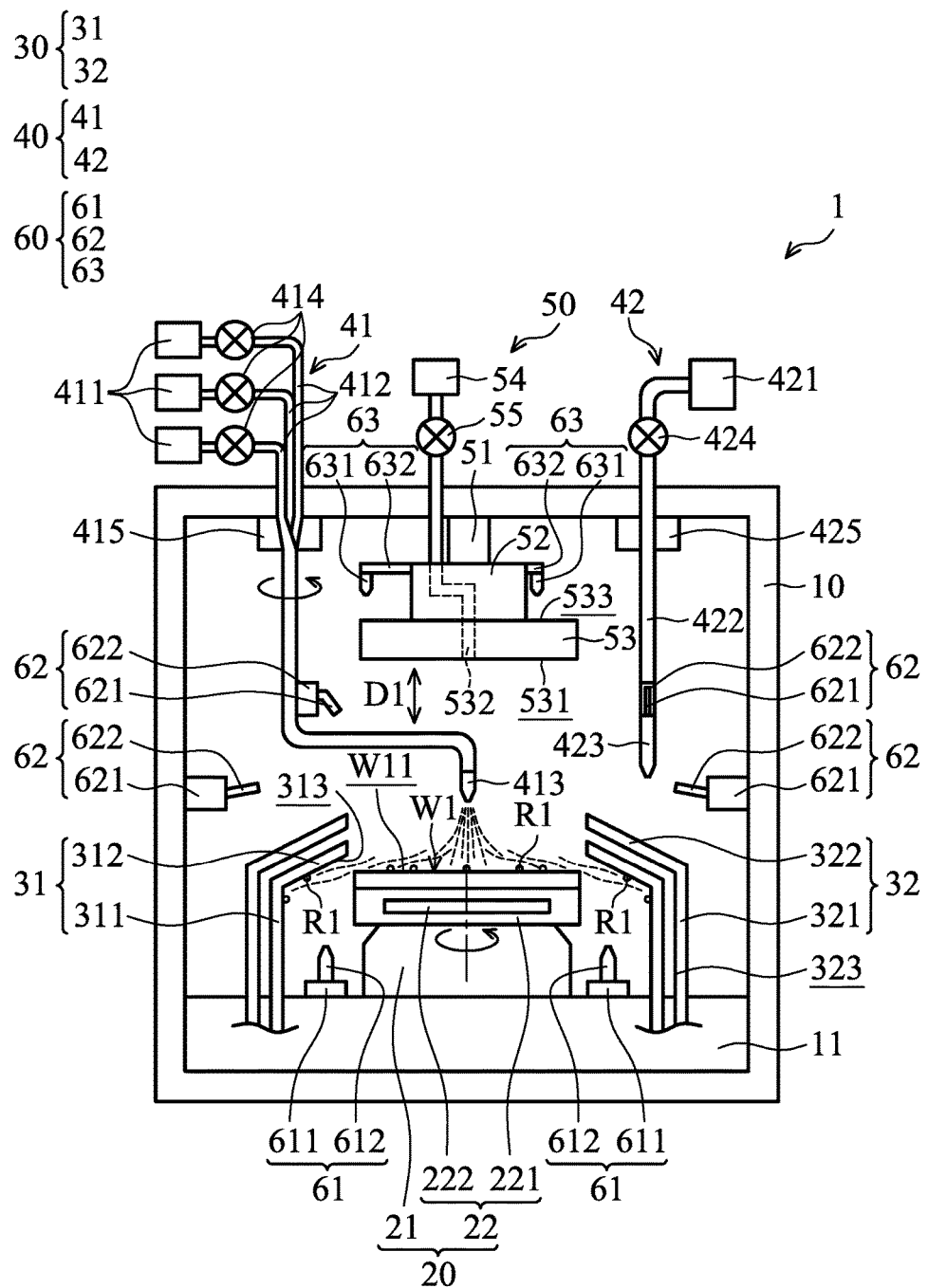

In step S103, the semiconductor apparatus 1 performs a wafer cleaning process on the wafer W1. The first cup 31 and the second cup 32 are raised to the operation position, as shown in FIG. 3B. The wafer W1 is rotated by the wafer chuck 22, and the dispensing device 40 dispenses cleaning liquid to the top surface W11 of the wafer W1.

In some embodiments, as shown in FIG. 3B, the rotation element 415 rotates the tubes 412 to place the tubes 412 and the dispensing nozzles 413 into the dispensing position over the central area of the wafer chuck 22 or the wafer W1. At least one of the dispensing nozzles 413 dispenses the cleaning liquid to the center of the top surface W11 of the wafer W1. The dispensing nozzles 413 alternately dispense cleaning liquid on the wafer W1 in sequence.

Since the wafer chuck 22 is rotated, the cleaning liquid flows from the center of the top surface W11 to the edge of the top surface W11, and sprays to the first cup 31 from the edge of the wafer W1. Therefore, the remains R1 on the top surface W11 of the wafer W1 are removed by the cleaning liquid.

Since the cleaning liquid with the remains R1 flows on the inner surface 313 of the first cup 31, some of the cleaning liquid and the remains R1 are left on the inner surface 313 to form contaminants C1 on the inner surface 313. Moreover, some of the cleaning liquid evaporates, and condensates on the dispensing devices 40 and the cleaning device 50. The contaminants C1 on the cups 30, the dispensing devices 40, and the cleaning device 50 may fall on a subsequent wafer, and cause defects on the wafer.

Figure 3C:
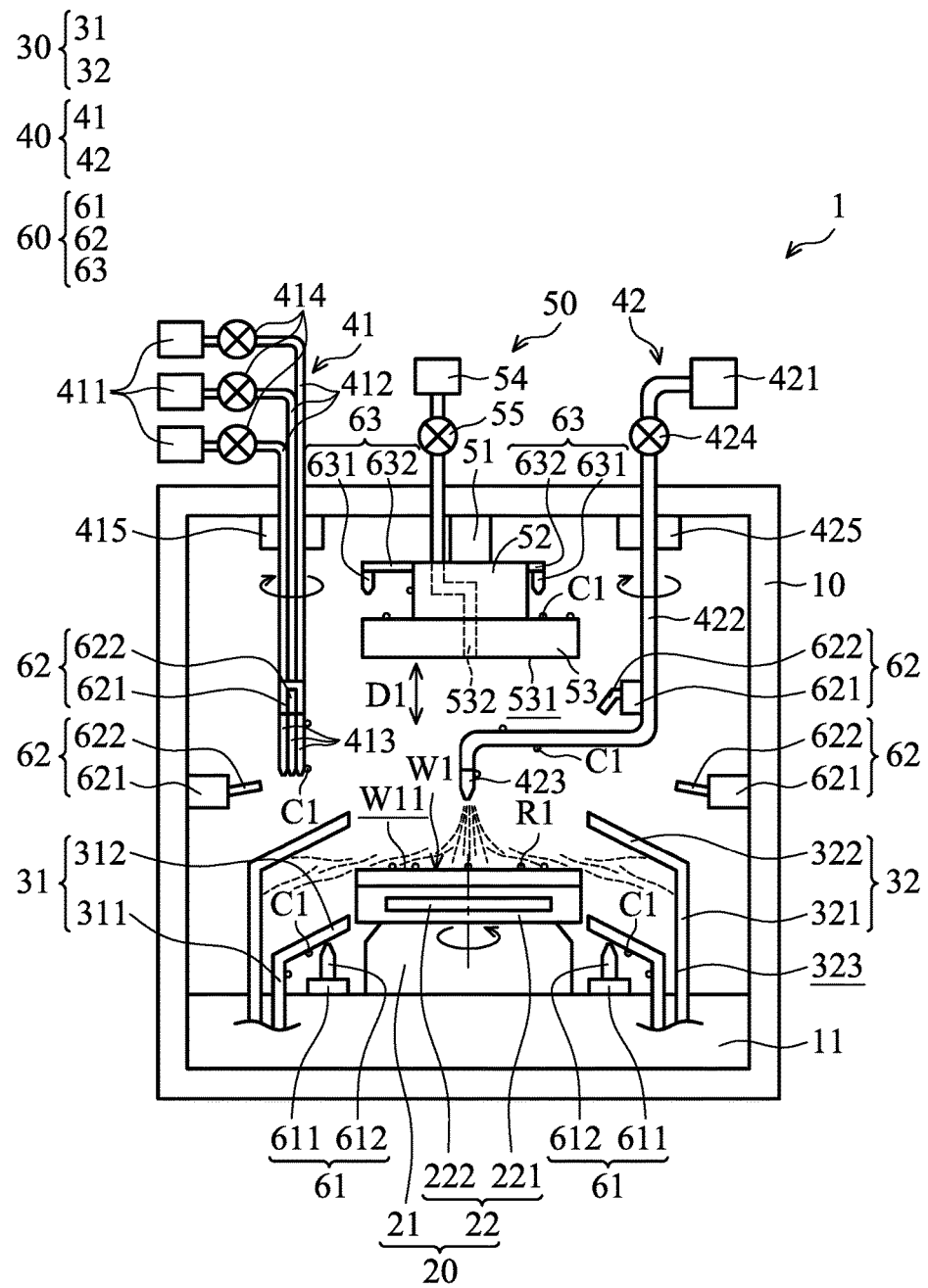

Afterwards, the rotation element 415 rotates the tubes 412 to put the tubes 412 and the dispensing nozzles 413 into the initial position, and the first cup 31 is lowered to the transportation position, as shown in FIG. 3C.

The rotation element 425 rotates the tube 422 to move the tube 422 and the dispensing nozzle 423 into the dispensing position over the central area of the wafer W1. The dispensing nozzle 423 dispenses the cleaning liquid to the center of the top surface W11 of the wafer W1.

In some embodiments, the cleaning liquid dispensed by the dispensing nozzle 423 is water, for example. Since the wafer chuck 22 is rotated, the water dispensed by the dispensing nozzle 423 washes the top surface W11 of the wafer W1, and sprays onto the second cup 32. Therefore, the remains R1 on the top surface W11 of the wafer W1 is further removed by the cleaning liquid.

Figure 3D:
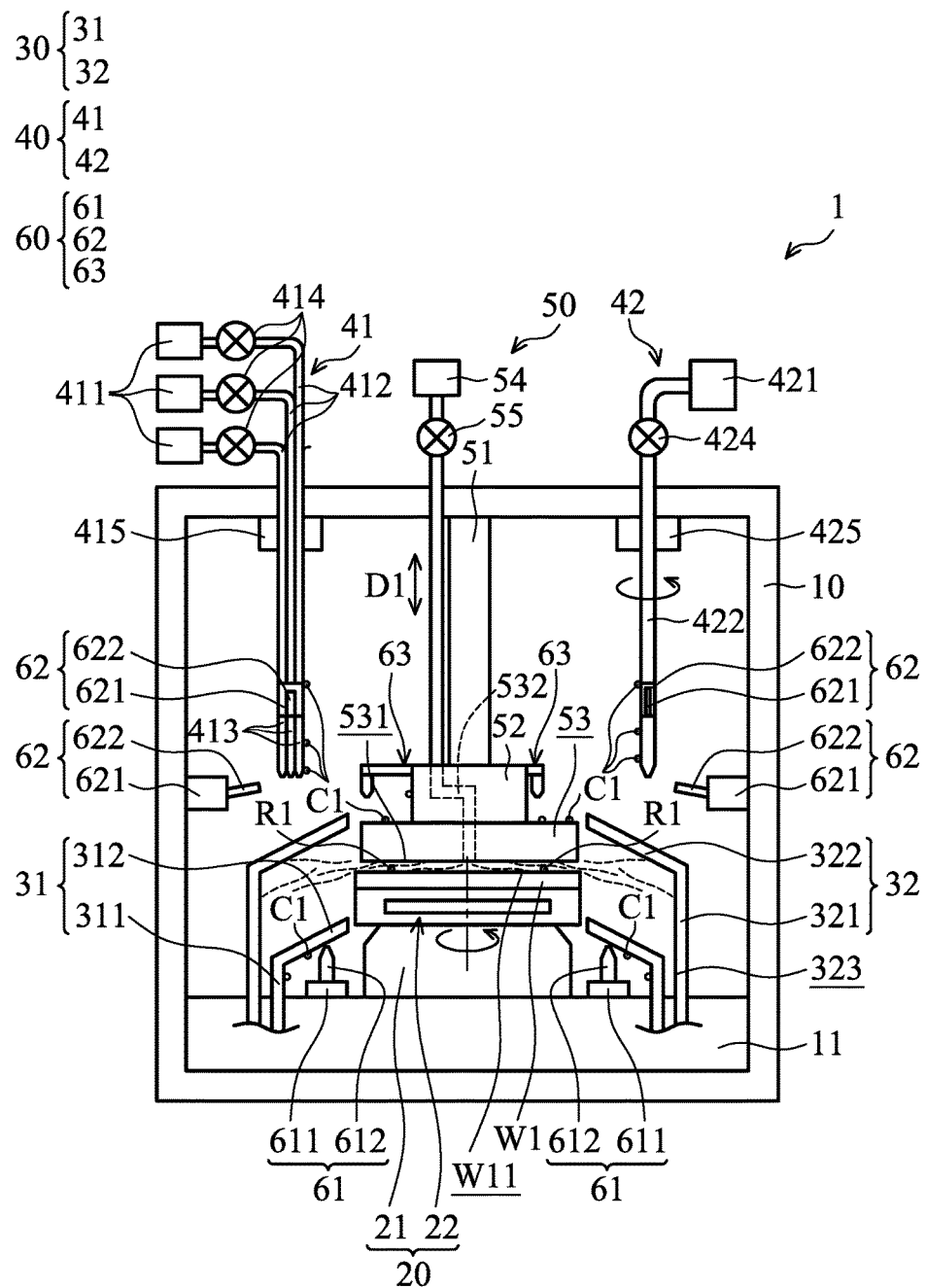

Afterwards, the rotation element 425 rotates the tubes 422 to put the tubes 422 and the dispensing nozzle 423 into the initial position, as shown in FIG. 3D.

In step S105, the cleaning device 50 dispenses washing liquid to the top surface W11 of the wafer W1. As shown in FIG. 3D, the cleaning plate 53 is moved toward the wafer W1 by the elevating mechanism 51. When the cleaning plate 53 is at the cleaning position, the liquid channel 532 dispenses washing liquid to the gap between the cleaning surface 531 and the top surface W11. Afterwards, the wafer W1 is rotated by the wafer chuck 22, and the cleaning plate 53 is rotated by the rotation mechanism 52.

A centrifugal force is applied to the washing liquid between the cleaning surface 531 and the top surface W11 by the rotation of the wafer W1 and the cleaning plate 53. The washing liquid between the cleaning surface 531 and the top surface W11 washes the top surface W11, and sprays to the second cup 32. Therefore, the remains R1 and the cleaning liquid on the top surface W11 of the wafer W1 are further removed by the washing liquid.

Figure 4:
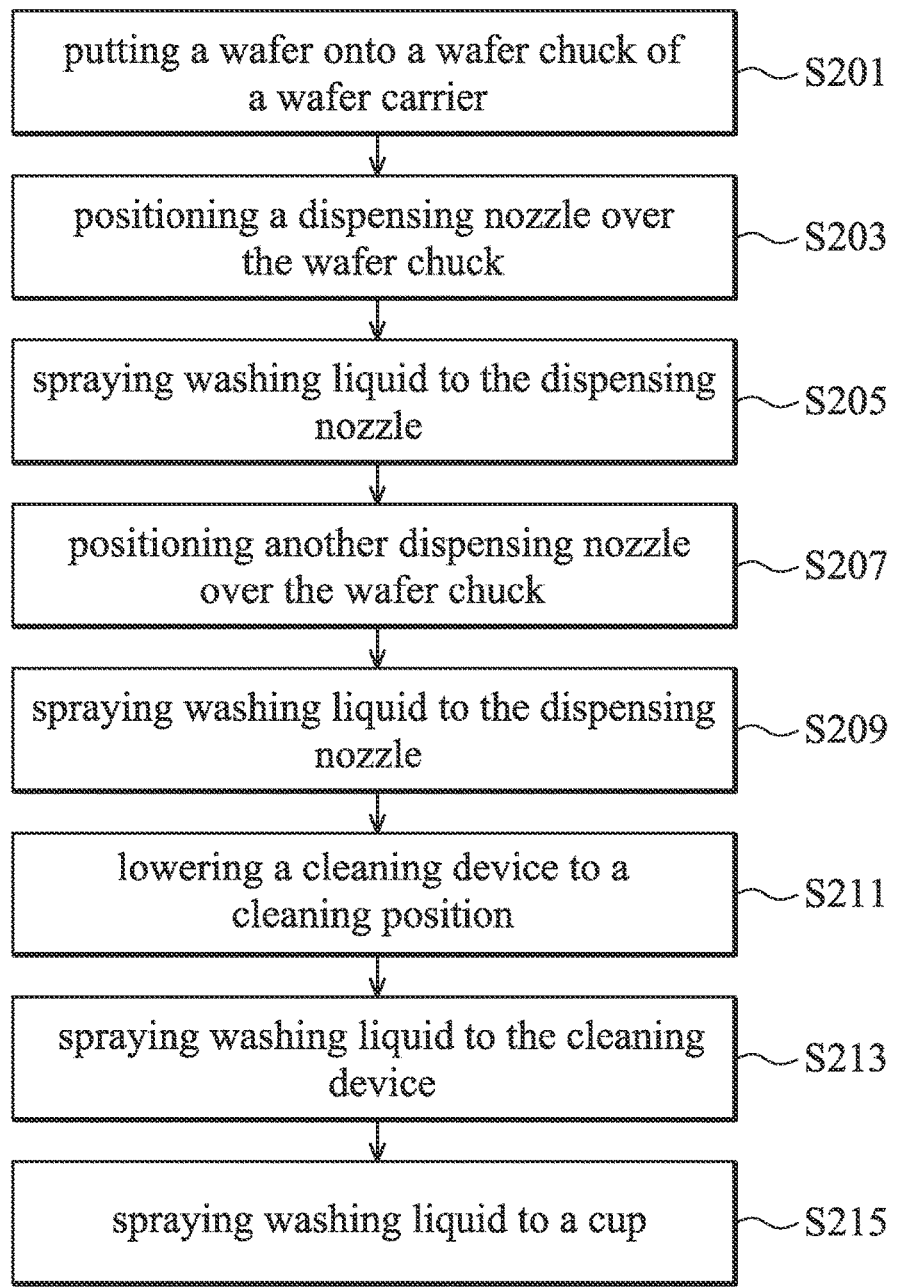
FIG. 4 is a flow chart of a washing method in accordance with some embodiments of the disclosure.
Figure 5A:
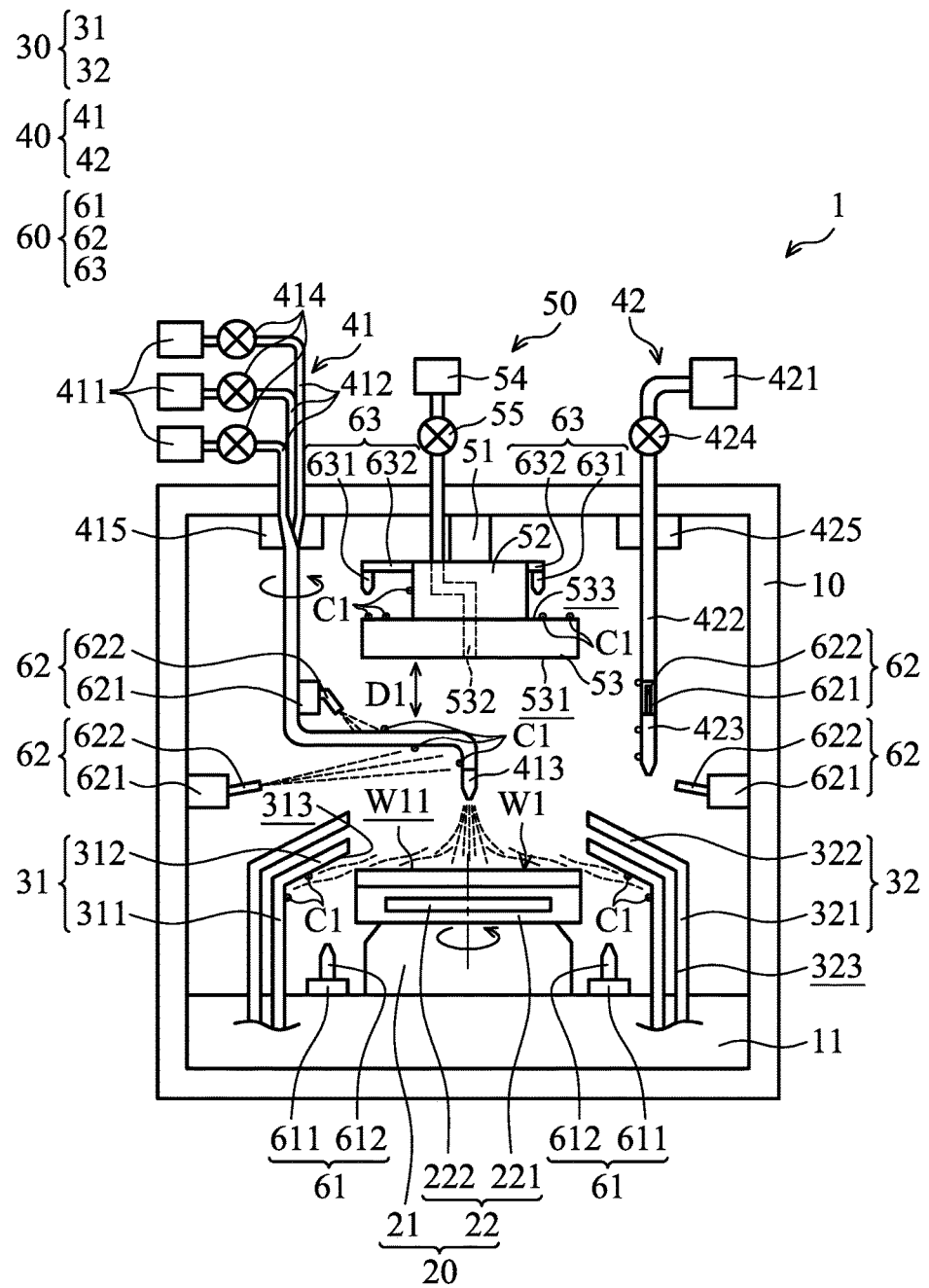
FIGS. 5A to 5C are schematic views of a semiconductor apparatus during an intermediate stage of the washing method in accordance with some embodiments of the disclosure.
Figure 5B:
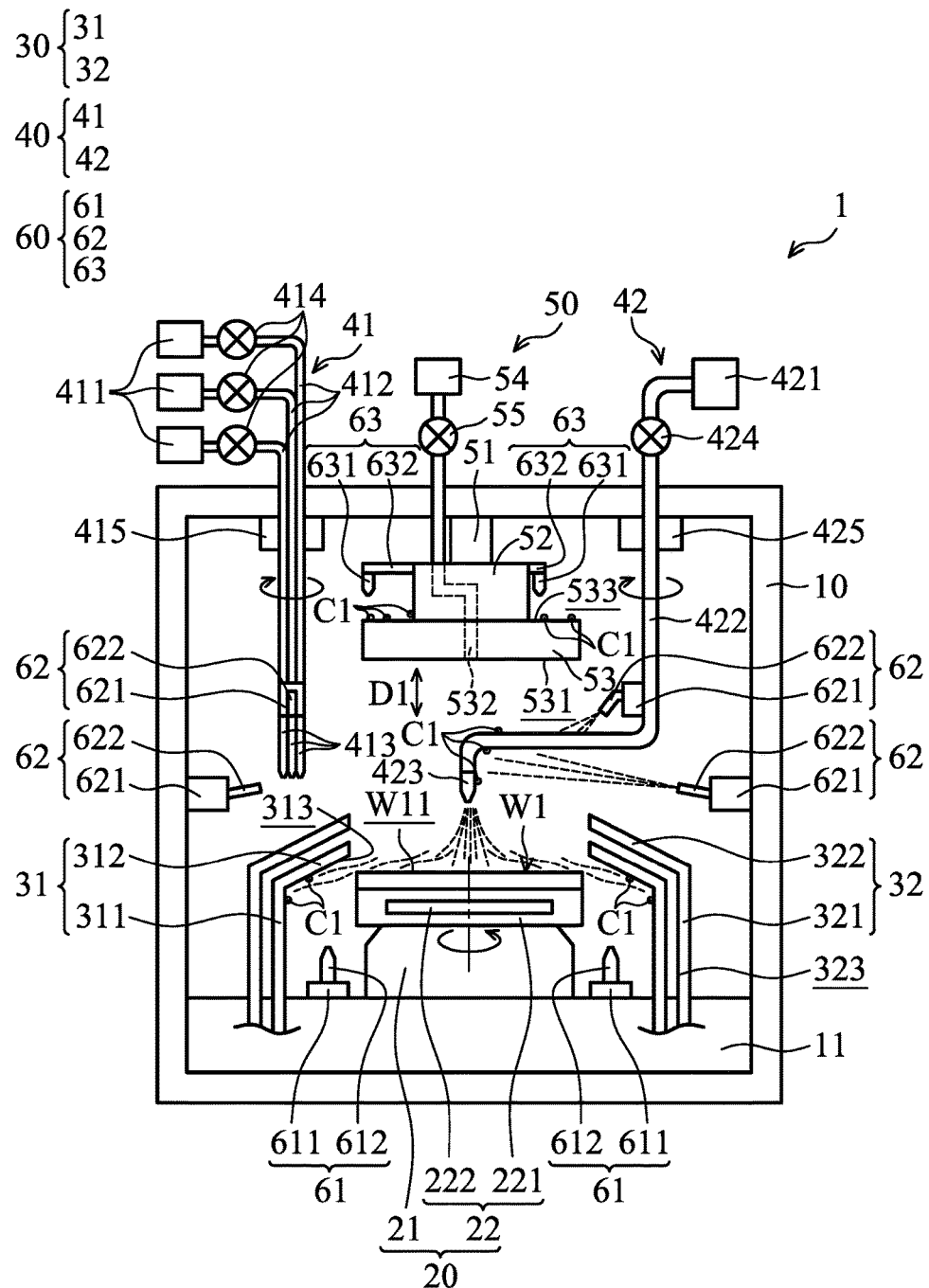
Figure 5C:
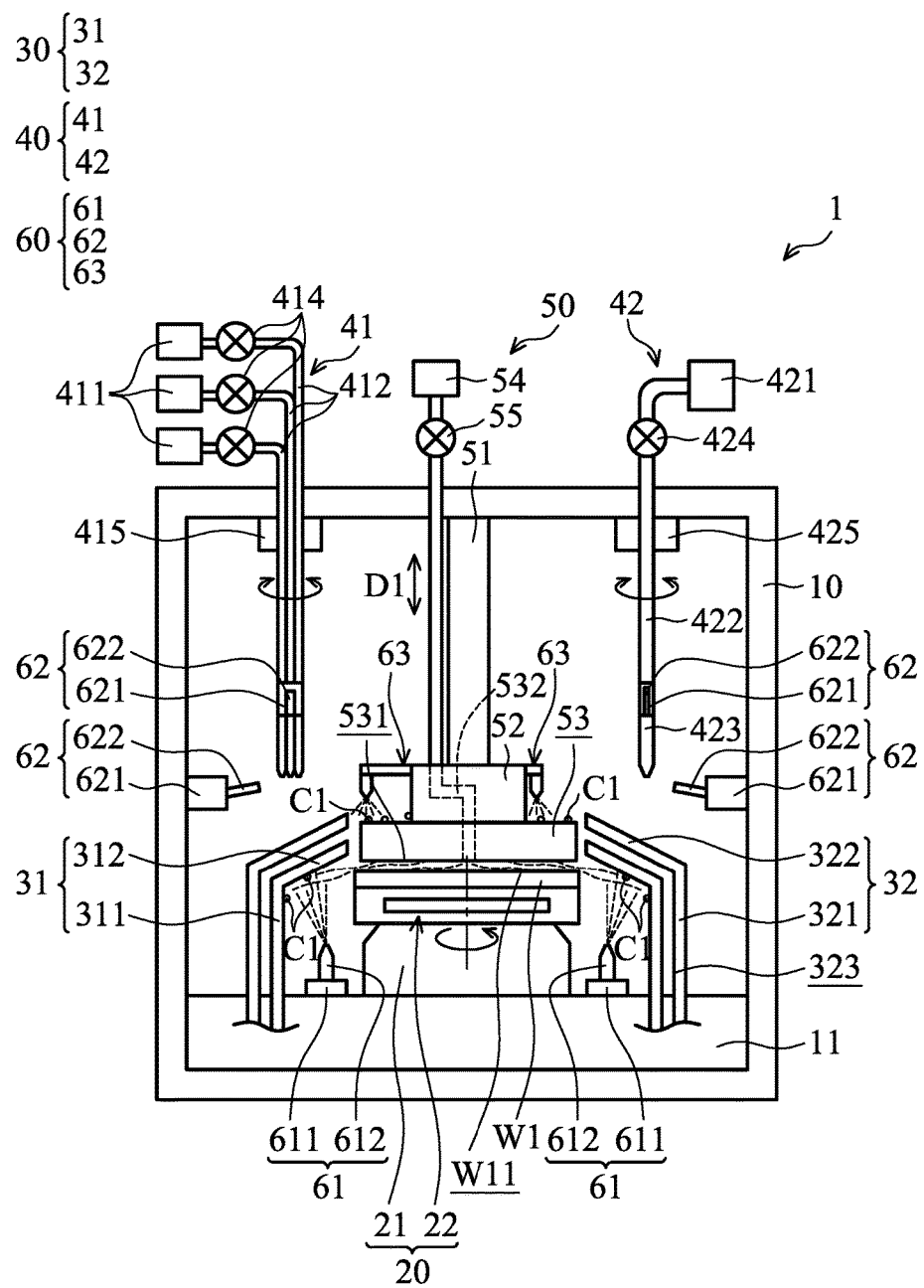

FIG. 4 is a flow chart of a washing method in accordance with some embodiments of the disclosure. FIGS. 5A to 5C are schematic views of a semiconductor apparatus 1 during an intermediate stage of the washing method in accordance with some embodiments of the disclosure.

In step S201, the wafer W1 is put onto the wafer chuck 22. In some embodiments, there is no wafer W1 put onto the wafer chuck 22. As shown in FIG. 3A, the first cup 31 and the second cup 32 are located at the transportation position. The dispensing devices 41 and 42 are located at the initial position. The cleaning device 50 is located at the top position.

In step S203, the dispensing device 41 is positioned over the wafer carrier 20 from the initial position. As shown in FIG. 5A, the dispensing nozzles 413 are located over the central area of the wafer W1 or the wafer chuck 22. The first cup 31 and the second cup 32 are raised to the operation position. In some embodiments, the first cup 31 is located at the transportation position.

In step S205, the middle washing devices 62 spray washing liquid to the dispensing device 41. In some embodiments, the middle washing devices 62 spray the washing liquid to the tubes 412 and the dispensing nozzles 413 as shown in FIG. 5A. Therefore, the contaminants C1 on the tubes 412 and the dispensing nozzles 413 can be removed by the washing liquid.

The washing liquid spraying to the dispensing device 40 flows down to the wafer W1 (or the wafer chuck 22). In some embodiments, the wafer chuck 22 or wafer W1 is rotated when the middle washing devices 62 spray the washing liquid to the dispensing device 41 or 42. Therefore, the washing liquid on the wafer W1 or the wafer chuck 22 is sprayed to the first cup 31 (or the second cup 32) by the rotation of the wafer W1 or the wafer chuck 22.

Afterwards, the dispensing device 41 is positioned back to the initial position, as shown in FIG. 5B. In step S207, the dispensing device 42 is positioned over the wafer carrier 20 from the initial position. As shown in FIG. 5B, the dispensing nozzle 423 is located over the central area of the wafer W1 or the wafer chuck 22.

In step S209, the middle washing devices 62 spray washing liquid to the dispensing device 42. In some embodiments, the middle washing devices 62 spray the washing liquid to the tube 422 and the dispensing nozzle 423 as shown in FIG. 5B. Therefore, the contaminants C1 on the tube 422 and the dispensing nozzle 423 can be removed by the washing liquid.

Afterwards, the dispensing device 42 is positioned back to the initial position, as shown in FIG. 5C. In step S211, the cleaning device 50 is lowered from the top position to the cleaning position close to the wafer W1 or the wafer chuck 22, as shown in FIG. 5C.

In step S213, the top washing device 63 sprays washing liquid to the cleaning device 50. As shown in FIG. 5C, the top washing device 63 sprays washing liquid to the cleaning plate 53. The cleaning plate 53 is rotated by a rotation mechanism 52. Therefore, the contaminants C1 on the cleaning plate 53 can be removed by the washing liquid.

The washing devices 60 can be automatically operated according to a recipe of the washing process, and thus the cups 30, the dispensing devices 40, the cleaning devices 50 can be automatically washed by the washing devices 60, but not only washed by manual. In some embodiments, the washing process can be performed between two wafer cleaning processes without shutting down the semiconductor apparatus 1. Therefore, the time required for maintenance of the semiconductor apparatus 1 is decreased.

In some embodiments, the liquid channel 532 of the cleaning plate 53 dispenses washing liquid to wafer W1 or the wafer W1. The cleaning plate 53 is rotated by a rotation mechanism 52, and the wafer W1 or the wafer chuck 22 is rotated by the wafer chuck 22.

Afterwards, the cleaning device 50 is raised the back to the top position. In step S215, the bottom washing device 61 sprays washing liquid to the inner surface 313 of the first cup 31. Therefore, the contaminants on the first cup 31 can be removed by the washing liquid.

In some embodiments, the bottom washing device 61 sprays washing liquid on the first cup 31 when the middle washing device 62 sprays washing liquid on the dispensing device 40. In some embodiments, the bottom washing device 61 sprays washing liquid on the first cup 31 when the top washing device 63 sprays washing liquid on the cleaning device 50.

Embodiments of a semiconductor apparatus and a washing method are provided. The contaminants C1 on the cups 30, the dispensing devices 40, and cleaning device 50 can be removed by washing devices 60. Since the washing devices 60 can be automatically operated. The washing process can be performed without shutting down the semiconductor apparatus 1. Moreover, the time required for maintenance of the semiconductor apparatus 1 is decreased.

In some embodiments, a semiconductor apparatus is provided. The semiconductor apparatus includes a wafer carrier, and a cup surrounding the wafer carrier. The semiconductor apparatus also includes a bottom washing device located between the wafer carrier and the cup, and configured to spray washing liquid onto the cup.

In some embodiments, a washing method for a semiconductor apparatus is provided. The washing method includes positioning a dispensing nozzle of a dispensing device over a wafer carrier from an initial position. The washing method also includes spraying washing liquid to the dispensing nozzle by a middle washing device. The washing method further includes spraying washing liquid to a cup surrounding the wafer carrier by a bottom washing device.

In some embodiments, a washing method for a semiconductor apparatus is provided. The washing method includes putting a wafer on a wafer chuck of a wafer carrier, and positioning a dispensing nozzle of a dispensing device over the wafer from an initial position. The washing method also includes spraying washing liquid to the dispensing nozzle by a middle washing device, and lowering a cleaning device from a top position to a cleaning position close to the wafer. The washing method also includes spraying washing liquid to the cleaning device by a top washing device; and spraying washing liquid to a cup surrounding the wafer carrier by a bottom washing device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A washing method for a semiconductor apparatus, comprising:
    moving a first cup to an operation position and positioning a dispensing nozzle of a dispensing device over a wafer carrier from an initial position, wherein, in the operation position, a first cover wall of the first cup is located higher than the wafer carrier;
    dispensing a cleaning liquid over the wafer carrier with the dispensing nozzle;
    moving the first cup from the operation position to a transportation position, wherein, in the transportation position, the first cover wall is located lower than the wafer carrier;
    lowering a cleaning device from a top position to a cleaning position close to the wafer carrier when the first cup is in the transportation position;
    spraying washing liquid to the wafer carrier by the cleaning device;
    spraying washing liquid to the dispensing nozzle by a middle washing device while the cleaning liquid is dispensed by the dispensing nozzle; and
    spraying washing liquid to the first cup by a bottom washing device.

2. The washing method as claimed in claim 1, wherein the dispensing device further comprises a tube connected to the dispensing nozzle, and the middle washing device is disposed on the tube.

3. The washing method as claimed in claim 1, further comprising
    spraying washing liquid to the cleaning device by a top washing device.

4. The washing method as claimed in claim 3, further comprising:
    spraying washing liquid to a cleaning plate of the cleaning device by the top washing device; and
    rotating the cleaning plate by a rotation mechanism.

5. The washing method as claimed in claim 4, wherein the top washing device is disposed on the rotation mechanism.

6. The washing method as claimed in claim 4, further comprising rotating a wafer chuck of the wafer carrier when the cleaning plate is rotated.

7. The washing method as claimed in claim 1, wherein the bottom washing device is located between the first cup and the wafer carrier.

8. The washing method as claimed in claim 1, further comprising:
    placing a wafer on the wafer carrier, wherein the first cup and a second cup that surrounds the first cup are located in the transportation position while the wafer is put on the wafer carrier, and the first cup and the second cup are moved from the transportation position to the operation position after the wafer is positioned on the wafer carrier;
    wherein the second cup is kept at the operation position, after the operation of moving the first cup to the transportation position and lowering the cleaning device.

9. A washing method for a semiconductor apparatus, comprising:
    putting a wafer onto a wafer chuck of a wafer carrier;
    moving a first cup to an operation position and positioning a dispensing nozzle of a dispensing device over the wafer from an initial position, wherein, in the operation position, a first cover wall of the first cup is located higher than the wafer carrier;
    dispensing a cleaning liquid over the wafer carrier with the dispensing nozzle;
    spraying washing liquid to the dispensing nozzle by a middle washing device;
    moving the first cup from the operation position to a transportation position, wherein, in the transportation position, the first cover wall is located lower than the wafer carrier;
    lowering a cleaning device from a top position to a cleaning position close to the wafer carrier when the first cup is in the transportation position;
    spraying washing liquid to the wafer on the wafer chuck by the cleaning device;
    spraying washing liquid to the cleaning device by a top washing device; and
    spraying washing liquid to the first cup by a bottom washing device, wherein washing liquid is sprayed by the bottom washing device after the cleaning device is lowered to the cleaning position.

10. The washing method as claimed in claim 9 wherein the dispensing device further comprises a tube connected to the dispensing nozzle, and the middle washing device is disposed on the tube.

11. The washing method as claimed in claim 9, further comprising:
    spraying washing liquid to a cleaning plate by the top washing device, and dispensing washing liquid to the wafer by a liquid channel of the cleaning plate, and
    rotating a cleaning plate of the cleaning device by a rotation mechanism, and rotating the wafer by the wafer chuck.

12. The washing method as claimed in claim 11, wherein the top washing device is disposed on the rotation mechanism.

13. The washing method as claimed in claim 9, wherein the first cup and a second cup that surrounds the first cup are located in the transportation position while the wafer is put on the wafer chuck, and the first cup and the second cup are moved from the transportation position to the operation position after the wafer is positioned on the wafer chuck;
    wherein the second cup is kept at the operation position, after the operation of moving the first cup to the transportation position and lowering the cleaning device.

14. A washing method for a semiconductor apparatus, comprising:
    putting a wafer onto a wafer chuck of a wafer carrier;
    moving a first cup to an operation position and positioning a dispensing nozzle of a dispensing device over the wafer from an initial position, wherein, in the operation position, a first cover wall of the first cup is located higher than the wafer carrier;
    dispensing a cleaning liquid over the wafer carrier with the dispensing nozzle;
    spraying washing liquid to the dispensing nozzle by a middle washing device;
    moving the first cup from the operation position to a transportation position, wherein, in the transportation position, the first cover wall is located lower than the wafer carrier;
    lowering a cleaning device from a top position to a cleaning position close to the wafer when the first cup is in the transportation position;
    spraying washing liquid to the wafer on the wafer chuck by the cleaning device;
    spraying washing liquid to the cleaning device by a top washing device; and spraying washing liquid to the first cup by a bottom washing device, wherein the spraying of washing liquid by the top washing device and the bottom washing device are performed simultaneously.

15. The washing method as claimed in claim 14, further comprising positioning the dispensing nozzle of the dispensing device back to the initial position.

16. The washing method as claimed in claim 14 wherein the dispensing device further comprises a tube connected to the dispensing nozzle, and the middle washing device is disposed on the tube.

17. The washing method as claimed in claim 14, further comprising:
   spraying washing liquid to a cleaning plate by the top washing device, and dispensing washing liquid to wafer by a liquid channel of the cleaning plate, and
   rotating a cleaning plate of the cleaning device by a rotation mechanism, and rotating the wafer by the wafer chuck.

18. The washing method as claimed in claim 14, wherein the first cup and a second cup that surrounds the first cup are located in the transportation position while the wafer is put on the wafer chuck, and the first cup and the second cup are moved from the transportation position to the operation position after the wafer is positioned on the wafer chuck;
   wherein the second cup is kept at the operation position, after the operation of moving the first cup to the transportation position and lowering the cleaning device.

* * * * *